(12) United States Patent
Nigg et al.

(10) Patent No.: US 6,837,374 B2
(45) Date of Patent: Jan. 4, 2005

(54) 300MM SINGLE STACKABLE FILM FRAME CARRIER

(75) Inventors: James Nigg, Howard Lake, MN (US); Michael Zabka, Barron, WI (US)

(73) Assignee: Entegris, Inc., Chaska, MN (US)

( * ) Notice: Subject to any disclaimer, the term of this patent is extended or adjusted under 35 U.S.C. 154(b) by 117 days.

(21) Appl. No.: 10/195,134

(22) Filed: Jul. 12, 2002

(65) Prior Publication Data

US 2003/0012628 A1 Jan. 16, 2003

Related U.S. Application Data

(60) Provisional application No. 60/305,639, filed on Jul. 15, 2001.

(51) Int. Cl.[7] .............................................. B65D 21/02
(52) U.S. Cl. ........................ 206/454; 206/509; 206/821
(58) Field of Search ................................ 206/499, 821, 206/449, 454, 701, 710, 714, 722, 725, 509, 564; 264/239; 269/903; 414/222.01, 935

(56) References Cited

U.S. PATENT DOCUMENTS

| 3,469,686 A | | 9/1969 | Gutsche et al. | |
| 3,482,682 A | | 12/1969 | Cronkhite | |
| 3,552,548 A | | 1/1971 | Wallestad et al. | |
| 3,672,495 A | | 6/1972 | Bauer et al. | |
| 4,057,142 A | | 11/1977 | Lechner et al. | |
| 4,511,038 A | * | 4/1985 | Miller et al. | ................. 206/454 |
| 4,647,509 A | * | 3/1987 | Wallace et al. | ........... 428/474.9 |
| 5,418,692 A | * | 5/1995 | Nemoto | ....................... 361/809 |
| 6,296,122 B1 | | 10/2001 | Nakazono et al. | |
| 6,553,733 B1 | * | 4/2003 | Hock et al. | ................... 52/306 |

* cited by examiner

*Primary Examiner*—Jim Foster
(74) *Attorney, Agent, or Firm*—Patterson, Thuente, Skaar & Christensen, P.A.

(57) ABSTRACT

An interlockable film frame carrier has central and peripheral portions for securely storing a film frame, the film frame supporting a film, a semiconductor wafer disposed on the film. The central portion has structure for supporting the semiconductor wafer and for allowing access to a lower surface of the stored film frame. The peripheral portion of the film frame carrier includes structure for supporting a peripheral portion of the film frame and matable stacking members. When the film frame is stored, two film frame carriers are interlocked by mating the stacking members. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims. 37 CFR §1.72 (b).

6 Claims, 3 Drawing Sheets

300MM SINGLE STACKABLE FILM FRAME CARRIER

CROSS-REFERENCES TO RELATED APPLICATIONS

This application claims priority under 35 U.S.C. § 119 (e) to, and hereby incorporates by reference, U.S. Provisional Application No. 60/305,639, filed Jul. 15, 2001.

BACKGROUND

1. Field of the Invention

This invention relates to carriers for semiconductors. In particular, this invention relates to single, stackable film frame carriers for semiconductors.

2. Background of the Invention

The present invention relates to thermal-formed, stackable carriers for film frames. Film frames are generally stainless-steel with a film extending across the film frame. The film has an adhesive on one side thereof. After being processed, a round semiconductor wafer is placed on the film. After being positioned on the film, the semiconductor wafer may be sectioned into individual pieces (e.g., chips), transported for further processing, or stored. The semiconductor processing industry is using larger and thinner wafers. These larger and thinner wafers present processing, transportation, and storage handling problems due to their greater fragility. To this end, conventional wafer carriers have often proven unacceptable for these larger and thinner wafers. The additional support provided by film frames reduces damages to wafers during these activities. Thus, film frames are being utilized to a much greater extent for transporting wafers and integrated circuit chips. However, there is a nonetheless need for a carrier to secure film frames and protect the wafers from damage during processing, transportation and storage. There is a further need to store and protect wafers being borne on film frame carriers in a space efficient manner.

SUMMARY OF THE INVENTION

The present film frame carrier needs many of the aforementioned needs. One embodiment of the present film frame carrier includes a central portion and a peripheral portion. The central portion is configured to provide a platform and a trough. The platform provides protection for the semiconductor wafer. The peripheral portion is configured to provide an access. The access and trough allow the film frame to be disposed and removed from the central portion of the present film frame carrier. When disposed in the present film frame carrier, a lower surface of the film frame rests on a ledge defined in the frame carrier peripheral portion. When two of the present film frames are mated by being interlocked, a lower surface of the trough contacts an upper surface of the film frame to secure the film frame in place. The mated film frames are further interlocked by being frictionally held in place by mated male and female stacking members.

The invention described and disclosed herein is a stackable film frame carrier configured to securely hold individual film frames in a horizontal orientation.

Stacking and interlocking the present film frame carriers with film frames disposed therebetween provides for economy in that more semiconductor wafers can be shipped or stored per unit volume. The practice of stacking and interlocking (mating) the film frame carriers with interposed film frames therebetween also decreases the likelihood that the film frame carriers will become dislodged thereby exposing the semiconductor wafer therein to damage.

Horizontally stacking film frame carriers provides stabilization of the film frames due to the effects of gravity.

Hence, film frame carriers configured to be horizontally stacked after being loaded with semiconductor wafers offer enhanced economy and a greatly decreased likelihood of wafer and chip damage during handling, storage, and transportation.

It is one advantage of the present carrier that wafers may be stored, transported, and processed in a stable horizontal orientation.

It is another advantage of the present carrier that wafers stored, handled, and transported horizontally therewithin are less susceptible to damage.

It is yet another advantage that the present carrier may be stackingly interlocked when nested in the manner disclosed herein.

Additional objects, advantages, and features of various embodiments of the present invention will be set forth in part in the description which follows, and in part will become apparent to those skilled in the art upon examination of the following or may be learned by practice of the invention. The objects and advantages of various embodiments of the invention may be realized and attained by means of the instrumentalities and combinations particularly pointed out in the appended claims.

BRIEF DESCRIPTION OF THE DRAWINGS

FIG. 3 is a cross-sectional view of the film frame carriers of FIG. 2 taken along lines 3—3.

Figure 1:
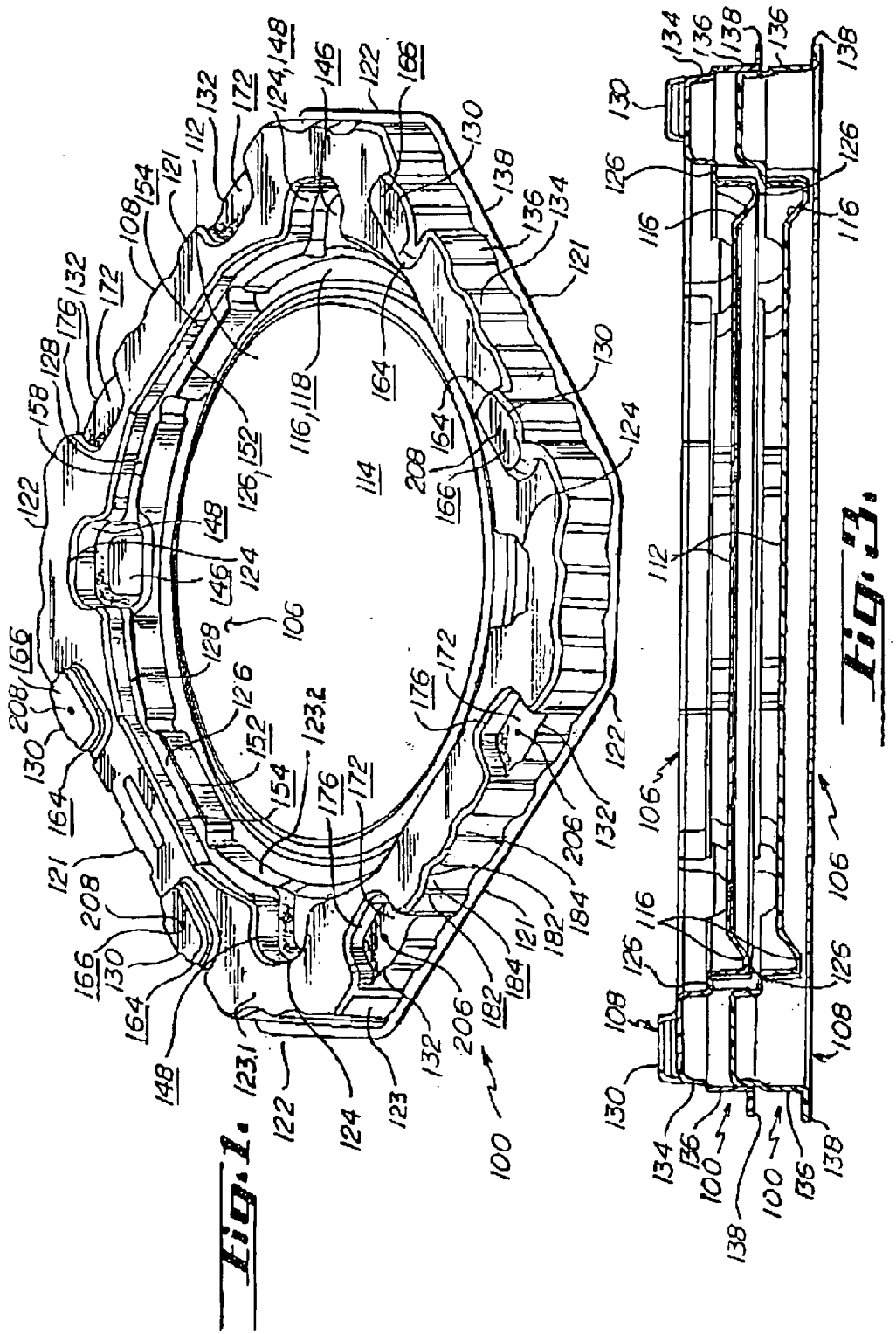
FIG. 1 is a perspective view of the present single stackable film frame carrier.
Figure 2:
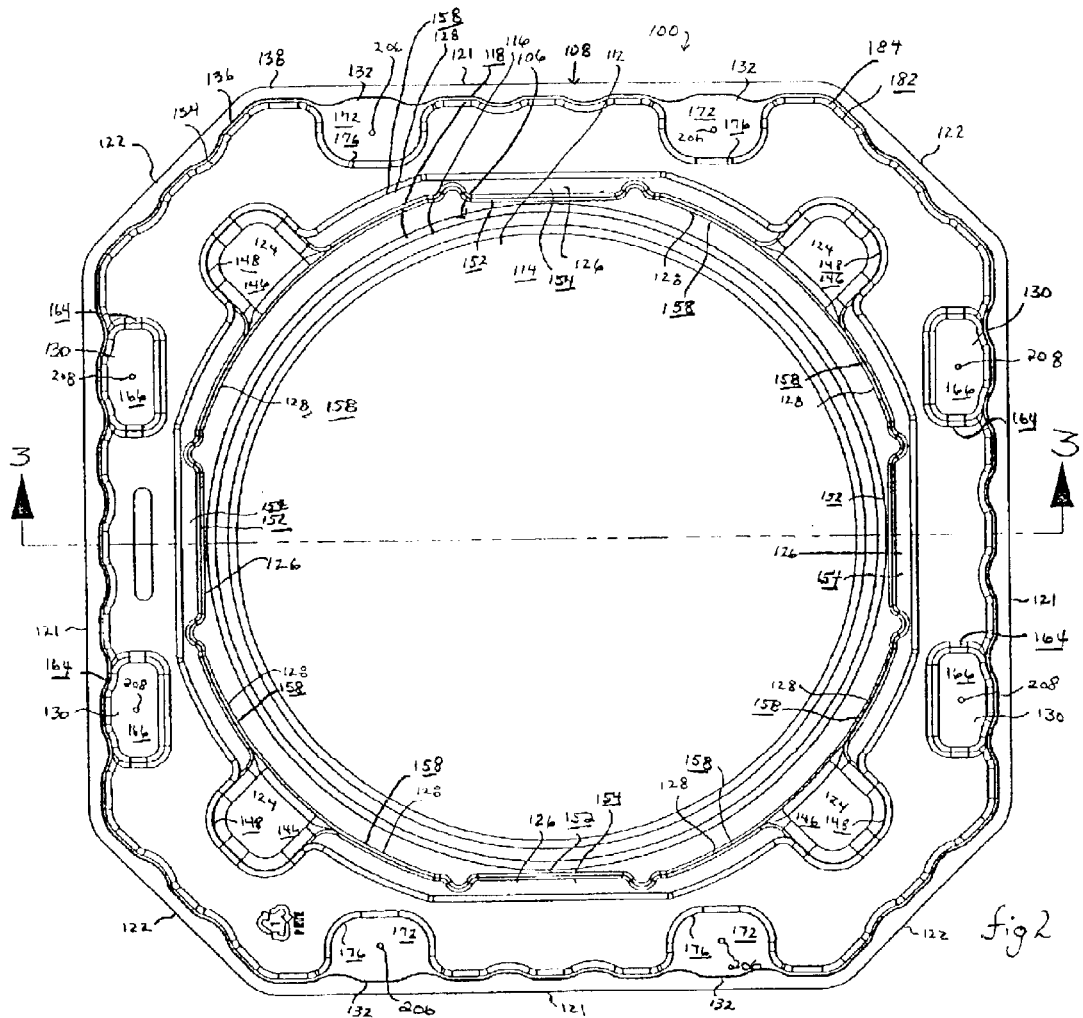
FIG. 2 is a plan view of a stacked pair of the film frame carriers of FIG. 1.
Figure 4:
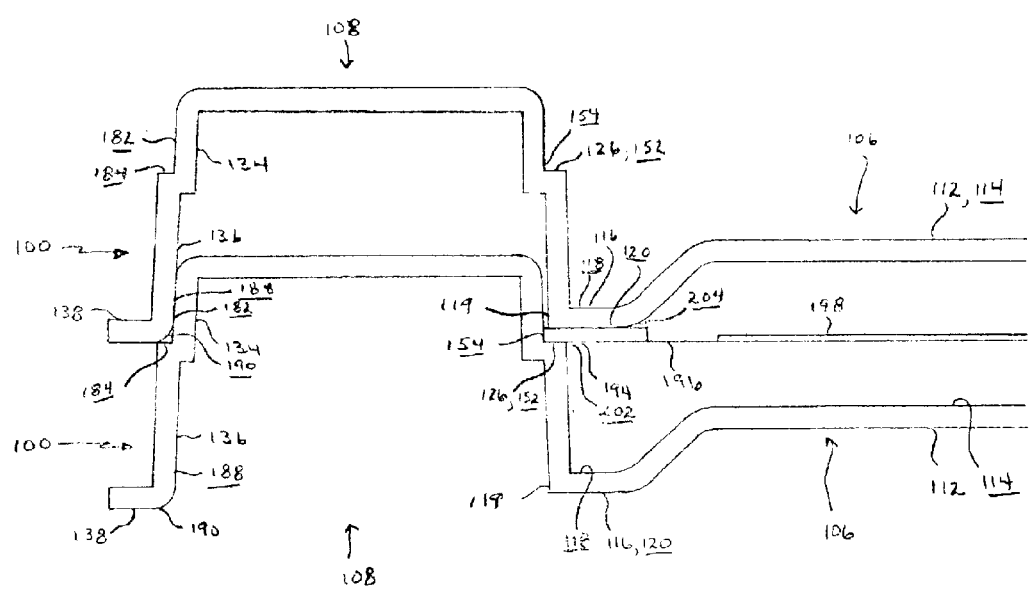
FIG. 4 is an enlarged partial cross-sectional view of the film frame carriers of FIG. 3.

It is understood that the above-described figures are only illustrative of the present invention and are not contemplated to limit the scope thereof

DETAILED DESCRIPTION OF THE INVENTION

Any references to such relative terms as inboard and outboard, upper and lower, and the like, are intended for convenience of description and are not intended to limit the present invention or its components to any one positional or spatial orientation.

One embodiment of the present single stackable film frame carrier is shown in the figures generally at 100. One suitable material for making the present film frame carrier is polyethylene terephthalate glycol between about 0.075 and 0.125 inch in thickness. However, it is recognized that several materials and thicknesses may be suitable for other embodiments. A conductor such as carbon may also be present in the synthetic resin used to make the present film frame carrier, for example, if static electricity dissipation is desired. The present film frame carrier is substantially unitary (or otherwise integral), having been thermally formed or vacuum molded from a single sheet of synthetic resin in one embodiment. However, the present film frame carrier may be envisioned as including a recessed central portion 106 and a raised peripheral portion 108. The central portion 106, in turn, may be envisioned as including a platform 112 having an upper surface 114 and a trough 116 with an upper surface 118 an outboard surface 119, and a lower surface 120. In the embodiment depicted, the platform 112 is generally circular and the trough 116 is concentrically disposed about the platform 112.

Relevant features of the peripheral portion 108 include four larger exterior sides 121, four smaller exterior sides 122, an outwardly facing wall 123, a top surface 123.1, an inwardly facing wall 123.2 a plurality of (e.g., four) inner accesses 124, a plurality of (e.g., four) ledges 126, a supporting structure such as an inner rim 128, a plurality of (e.g., four) male stacking members 130, a plurality of (e.g., four) female stacking members 132, respective first and second outer rims 134 and 136, and a lower edge portion confirmed as a flange 138. The male and female stacking members are embodiments of the nestable stacking members of this invention. Each inner access 124 displays an upper surface 146 and an inboard surface 148. The inner accesses 124 generally open into the trough 116 and are generally disposed at about 90 degrees with respect to each other. The inner accesses 124 are configured to allow access to the lower side of a film frame stored in the present frame cater. Each ledge 126 displays an upper surface 152 and an inboard surface 154. The ledges 126 are formed in the peripheral portion 108 and are generally spaced apart at about 90 degrees and are generally intermediate between the inner accesses 124. The ledges 126 and troughs 116 are also considered as nestable stacking members when two or more of the present frame carriers are stacked in a manner such as more fully described below. Each inner rim 128 displays an inboard surface 158 and is disposed between an inner access 124 and an adjacent ledge 126. Each male stacking member 130 displays opposed inner and outer peripheral surfaces 162 and 164 and opposed upper and lower surfaces 166 and 168. The wale stacking members 130 generally extend above the remainder of the peripheral portion 108. Two of the male stacking members 130 are spaced apart proximate each of the larger exterior sides 121. Bath female stacking member 132 is disposed proximate generally opposite, and opens toward, larger sides 121 and displays generally opposing upper and lower surfaces 172 and 374 and opposing outward and inboard surfaces 176 and 178. The female stacking members 132 are formed in the peripheral portion 108 and are disposed in pairs proximate the larger sides 121, which are not proximate the male stacking members 130. The first outer rim 134 displays an outboard surface 182 and an upper surface 184. The relevant features of the second outer rim 136 include an inner surface 188 and a lower surface 190. The second outer rim 136 extends outboard from, and below, the first outer rim 134. The flange 138 extends generally orthogonally from a lower tip of the second outer rim 136.

A film frame 194 stored in the present frame carrier may be a substantially circular rigid (e.g., steel) member to which a film 196 is attached. An adhesive coating is usually present on one side of the film 196. A semiconductor wafer 198 is positioned on the film 196 and held in place by the adhesive coating. Functionally, the film frame 194, and semiconductor wafer 198 positioned on the film 196, are positioned within the peripheral portion 108 of the present frame carrier. The semiconductor 198 is positioned such that the semiconductor wafer 198 extends over the upper surface 114 of the platform 112. A peripheral portion of a lower surface 202 of the film frame 194 rests on the upper surface 152 and abuts the inboard surface 154 of the ledge 126. The accesses 124 enable access of digits from a person or robot to place the film frame 194 (and semiconductor 198) in the present frame carrier by providing access to the underside 202 of the film frame 194, thereby allowing the film frame 194 to be lowered into, or lifted from, the present film frame 100 either manually or robotically.

When two of the present frame carriers 100 are mated, the lower surface 120 of the trough 116 contacts an upper surface 204 of the film frame 194, thereby securing the film frame 194 in place. Also, as two of the present film frame carriers 100 are being mated, the male stacking members 130 of the lower frame carrier 100 are forced into the male stacking members 130 of the upper frame carrier 100, thereby sliding the peripheral outer surface 164 of the lower frame carrier against the peripheral inner surface 162 of the upper frame carrier to some extent. As the male stacking members are being mated, the female stacking member outboard surface 176 of the lower frame carrier is slid against the female stacking member inboard surface 178 of the upper frame carrier to some extent. As the male and female members are being interlocked, the inner surface 188 and lower surface 190 of the upper frame second outer rim contacts the outboard surface 182 and upper surface 184 of the lower frame carrier first outer rim. When two of the present frame carriers 100 are mated as described above, they may be further secured by placing rivets through adjacent, mated female stacking members 132, e.g., at points 206 and through adjacent mated male stacking members 130, e.g., at points 208. While the above description describes mating only two of the present film carriers, obviously any desired number may be mated in this fashion.

It should be understood that a person of ordinary skill in the art would readily comprehend and adapt the present frame carrier so that a plurality of the film frames may be secured between two of the present, nested frame carriers. It should be further understood that a person of ordinary skill the art would readily comprehend that a semiconductor wafer, without a film frame, could be disposed and secured within to the present, nested frame carriers as well.

Because numerous and modifications of this invention may be made without departing from the spirit thereof, the scope of the invention is not to be limited to the embodiments illustrated and described. Rather, the scope of the invention is to be determined by the appended claims and their equivalents.

What is claimed is:

1. A combination pair of like shaped carriers and a film frame sandwiched therebetween, the film frame comprising a generally planar ring-shaped frame defining an open area and having an outer edge portion, and a film traversing the open area, the carriers comprising an upper carrier and a lower carrier, each of the carriers comprising:

a raised peripheral portion defining a pocket for receiving the film frame, and a recessed central portion positioned below the film frame, the peripheral portion having an upper surface, an outwardly facing wall extending downwardly from the upper surface and an inwardly facing wall extending downwardly from the upper surface to the central portion, the outwardly facing wall having an outer ledge and terminating in a flange, the inwardly facing wall having an inner ledge positioned intermediate the upper surface and the central portion;

the central portion comprising a central platform and a trough intermediate the central platform and the inwardly facing wall, the trough extending below the central platform, the upper carrier stacked on the lower carrier with the flange of the upper carrier contacting the ledge of the outwardly facing wall of the lower carrier and with the lower carrier having the edge portion of the frame of the film frame seated on its inner ledge and the trough of the upper carrier seated on top of the film frame with the only contact of the upper and lower carrier with the film frame being at said ledge and trough.

2. The combination of claim 1 wherein each of the carriers has four of said inner ledges.

3. The combination of claim 1 wherein the each carrier is formed of a sheet of polymer.

4. The combination of claim 1 wherein the sheet of polymer is between about 0.075 and 0.125 inch in thickness.

5. The combination of claim 4, in which the sheet of polymer is comprised of polyethylene terephthalate glycol.

6. The combination of claim 1, wherein the peripheral portion of each carrier has a plurality of inner accesses configured as depressions extending into the upper surface and inwardly facing wall providing access to an underside of the film frame for lowering the film frame into each of said carriers or lifting the film frame from each of said carriers.

* * * * *